(12) United States Patent
Shin

(10) Patent No.: US 7,535,174 B2
(45) Date of Patent: May 19, 2009

(54) PLASMA DISPLAY MODULE WITH A CHASSIS BASE HAVING GAP PADS

(75) Inventor: Dong Hyok Shin, Yongin-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/512,399

(22) Filed: Aug. 30, 2006

(65) Prior Publication Data
US 2007/0052335 A1 Mar. 8, 2007

(30) Foreign Application Priority Data
Aug. 30, 2005 (KR) ...................... 10-2005-0080070

(51) Int. Cl.
*G06F 1/16* (2006.01)
*H05K 7/20* (2006.01)
*H01J 1/18* (2006.01)
*H05K 5/00* (2006.01)

(52) U.S. Cl. ............................ 313/582; 313/36; 313/46; 361/681; 361/704; 348/836

(58) Field of Classification Search ......... 313/582–587; 361/681–682, 688–747
See application file for complete search history.

(56) References Cited
U.S. PATENT DOCUMENTS

| | | | |
|---|---|---|---|
| 5,971,566 A | * | 10/1999 | Tani et al. .................... 362/294 |
| 7,130,005 B2 | | 10/2006 | Takata et al. |
| 2005/0077822 A1 | * | 4/2005 | Kim et al. .................... 313/582 |
| 2005/0093429 A1 | * | 5/2005 | Ahn et al. .................... 313/498 |
| 2005/0174301 A1 | * | 8/2005 | Kim .......................... 345/3.1 |
| 2005/0236995 A1 | * | 10/2005 | Bang et al. ................... 313/587 |
| 2005/0243106 A1 | * | 11/2005 | Bae et al. .................... 345/679 |

FOREIGN PATENT DOCUMENTS

| | | | |
|---|---|---|---|
| JP | 2004-272237 | | 9/2004 |
| KR | 10-2005-0050450 | * | 5/2005 |

OTHER PUBLICATIONS

Bae, Korean Patent Publication 10-2005-0050450, May 2005, machine_translation.*

* cited by examiner

*Primary Examiner*—Sikha Roy
*Assistant Examiner*—Tracie Y Green
(74) *Attorney, Agent, or Firm*—Lee & Morse, P.C.

(57) ABSTRACT

A plasma display module including a plasma display panel having front and rear surfaces, a chassis base made of a synthetic resin, having mounting holes formed therein, and being mounted on the rear surface of the plasma display panel, a heat conductive sheet disposed between the plasma display panel and the chassis base, a plurality of driving boards being mounted on a rear surface of the chassis base, the driving boards having a plurality of circuits connected to the plasma display panel by means of signal lines, and a plurality of gap pads mounted in the mounting holes formed in the chassis base to transfer heat generated from the driving boards to the heat conductive sheet, thereby discharging the heat.

19 Claims, 4 Drawing Sheets

PLASMA DISPLAY MODULE WITH A CHASSIS BASE HAVING GAP PADS

BACKGROUND OF THE INVENTION

1. Field of the Invention

The present invention relates to a plasma display module. More particularly, the present invention relates to a plasma display module having improved heat discharging capabilities.

2. Description of the Prior Art

In general, a plasma display apparatus refers to a flat display device which uses a plasma display panel (PDP) to display images using gas discharge phenomenon. Plasma display apparatuses have superior characteristic as compared to cathode ray tube (CRT) display apparatuses and other flat display apparatuses, such as liquid crystal display (LCD) panels. For example, plasma display apparatuses are thinner, lighter, and provide larger screens as compared to CRT display apparatuses, while they provide brighter picture with wider viewing angles as compared to LCD panels.

A plasma display apparatus may include a PDP having two substrates with a plurality of discharging electrodes, discharging gases injected into predefined spaces between the substrates, and a fluorescent layer; a chassis base; and circuit elements to drive the PDP. When a predetermined amount of electricity is applied to the discharging electrodes, ultraviolet (UV) light is generated between the substrates. The UV light excites the fluorescent layer, which subsequently, emits light to form images on the PDP.

A large amount of heat may be generated from the plasma display module when the PDP is operating. In order to dissipate the large amount of heat generated, a known PDP may include a heat conductive sheet with improved heat conductivity that is disposed between the PDP and the chassis base and facilitates heat transfer from the PDP to the chassis base. A known PDP may also include either a heat discharging plate attached thereto or gap pads interposed between the driving boards and the chassis base, both of which are intended to transfer heat from the driving boards.

An additional method for reducing the large amount of heat generated by the PDP may include reduction of the electric power consumption of the plasma display module and decrease of its electromagnetic waves generation by replacing the material forming the chassis base. In particular, attempts have been made to replace the expensive aluminum chassis base with an inexpensive resin chassis base having a reduced weight as well as cost, while exhibiting low heat discharging capabilities. However, the known heat discharging plate and gap pads are not sufficient for discharging the heat of the driving boards transferred through a resin chassis base having low heat conductivity.

Accordingly, there exists a need to improve the structure of the chassis base in order to rapidly discharge the large amount of heat generated by the operation of the PDP. More importantly, there exists a need to improve the structure of the gap pads corresponding to a chassis base having low heat discharging capabilities to provide efficient heat dissipation from the driving boards.

SUMMARY OF THE INVENTION

The present invention is therefore directed to a plasma display module, which substantially overcomes one or more of the disadvantages of the related art.

It is therefore a feature of an embodiment of the present invention to provide a plasma display module which is capable of effectively discharging heat from the driving boards.

It is therefore another feature of an embodiment of the present invention to provide a plasma display module containing gap pads having improved heat discharging capabilities.

It is yet another feature of an embodiment of the present invention to provide a plasma display module which can absorb vibrations generated by the driving boards.

At least one of the above and other features and advantages of the present invention may be realized by providing a plasma display module including a PDP having front and rear surfaces, a chassis base made of a synthetic resin, the chassis base being mounted on the rear surface of the plasma display panel and including a synthetic resin and a plurality of mounting holes, a heat conductive sheet disposed between the plasma display panel and the chassis base, a plurality of driving boards being mounted on a rear surface of the chassis base, the driving boards including a plurality of circuits electrically connected to the plasma display panel, and a plurality of gap pads mounted in the mounting holes of the chassis base between the heat conductive sheet and the driving boards.

The gap pads in the present invention may be in contact with the driving boards at one side thereof and in contact with the heat conductive sheet at another side thereof. Furthermore, the gap pads may be heat discharging members exhibiting excellent heat conductivity or electrically conductive members exhibiting electrical conductivity. The gap pads may also be formed such that only their peripheral surface is coated with a conductive material. In addition, the gap pads may be capable of absorbing vibrations generated by the driving boards.

The heat conductive sheet of the present invention may be made of graphite, aluminum, or a like material.

The chassis base of the present invention may be formed of at least one synthetic resin selected from a thermosetting resin, a thermoplastic resin, and combinations thereof, while the synthetic resin may also include a reinforcing material added to the synthetic resin.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
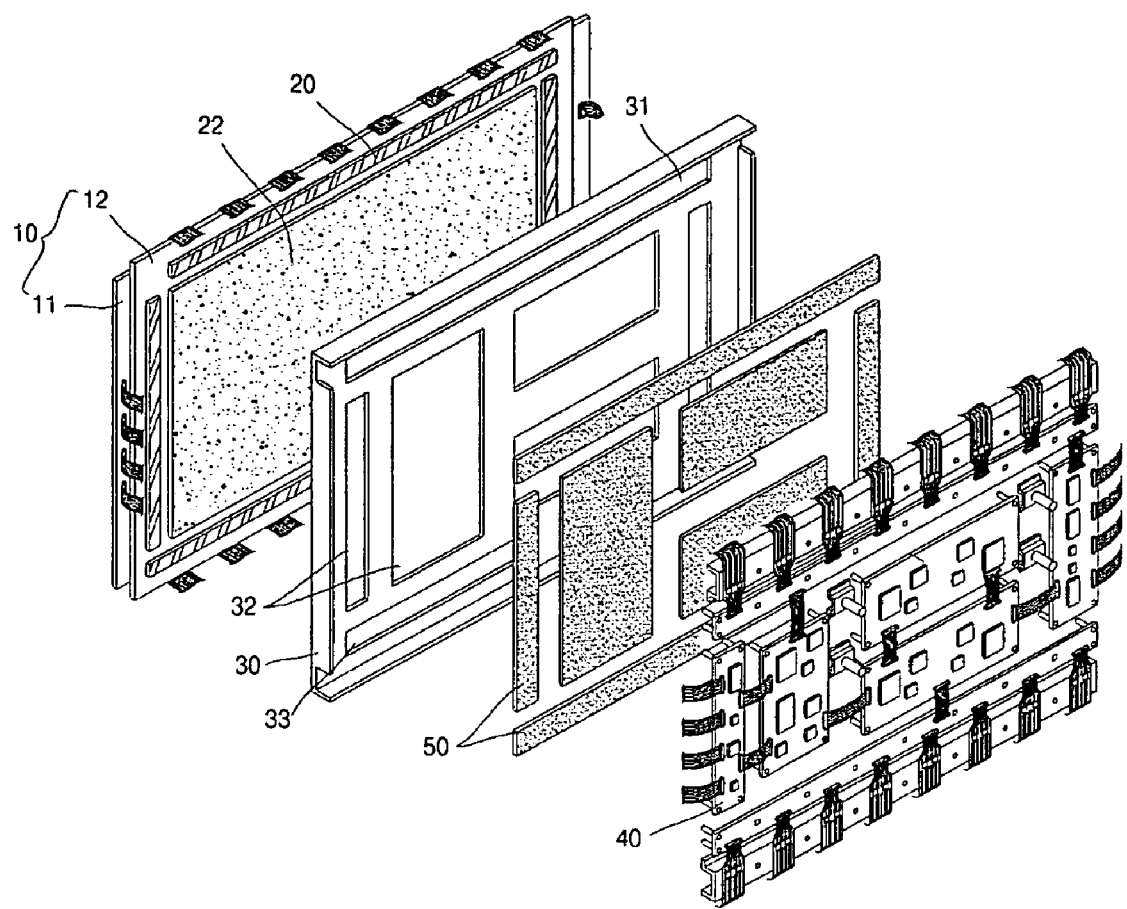
FIG. 1 illustrates an exploded perspective view of a plasma display module according to an embodiment of the present invention.

Korean Patent Application No. 10-2005-0080070, filed on Aug. 30, 2005, in the Korean Intellectual Property Office, and entitled: "PLASMA DISPLAY MODULE", is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete; and will fully convey the scope of the invention to those skilled in the art. In the figures, the dimensions of elements and regions are exaggerated for clarity of illustration. It will also be understood that when an element is referred to as being "on" another element or substrate, it can be directly on the other element or substrate, or intervening elements may also be present. Further, it will be understood that when an element is referred to as being "under" another element, it can be directly under, and one or more intervening elements may also be present. In addition, it will also be understood that when an element is referred to as being "between" two elements, it can be the only element between the two elements, or one or more intervening elements may also be present. Like reference numerals refer to like elements throughout.

Figure 2:
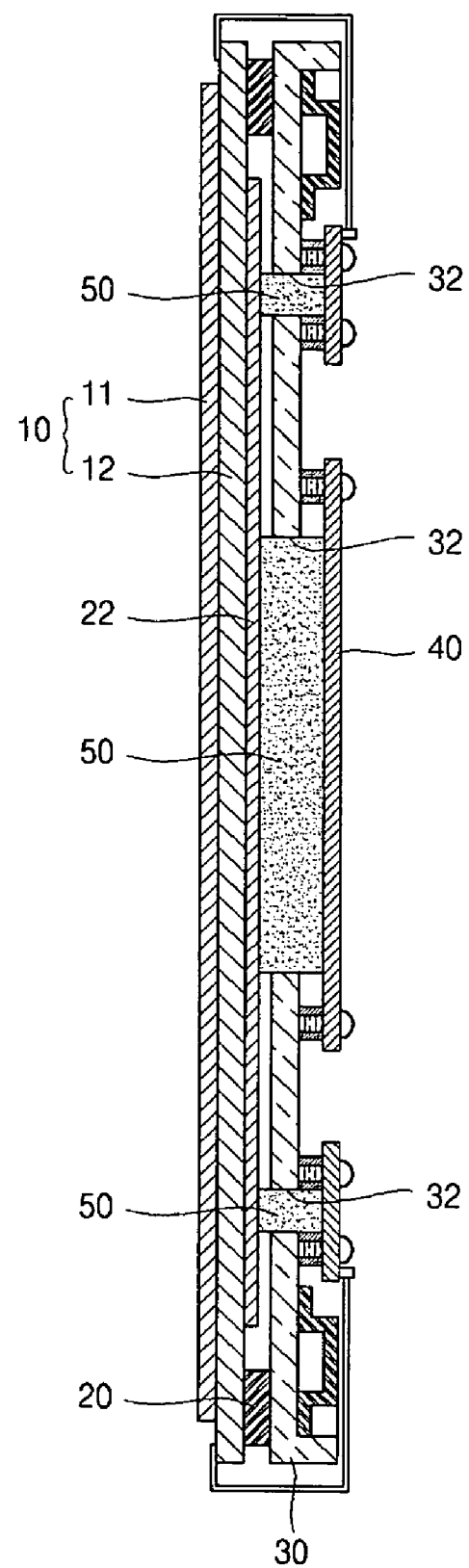
FIG. 2 illustrates a sectional view of a plasma display module according to an embodiment of the present invention.

FIG. 1 illustrates an exploded perspective view of a plasma display module according to an embodiment of the present invention, and FIG. 2 illustrates a sectional view of a plasma display module according to an embodiment of the present invention.

As illustrated in FIGS. 1 and 2, the plasma display module may include a PDP 10 for displaying images, a chassis base 30 made of a synthetic resin and mounted on the rear surface of the PDP 10 to support the PDP 10, and driving boards 40 mounted on the rear surface of the chassis base 30 and electrically connected to the PDP 10 by signal lines for driving the PDP 10.

The PDP 10 may include a front substrate 11, a rear substrate 12, and discharging cells (not shown) formed between the front and rear substrates 11 and 12. Substrates 11 and 12 may be attached to each other.

An adhesive member 20, e.g., strips of double-sided tape, may be adhered to the edge of the rear surface of the PDP 10 to attach the chassis base 30 to the PDP 10. Additionally, a heat conductive sheet 22 may be attached to the rear surface of the PDP 10 to discharge heat generated during the operation of the PDP 10. The heat conductive sheet 22 may be a material having high and uniform heat conductivity, e.g., graphite. The heat conductive sheet 22 may also be made of aluminum or aluminum alloy to provide a way for grounding the driving boards 40.

The chassis base 30 may support and protect the PDP 10, while providing a mounting space on its rear surface to mount the driving boards 40. The chassis base 30 may be made of a synthetic resin including a thermoplastic resin such as polypropylene, polyamide, and so forth; a thermosetting resin such as phenol, epoxy, and so forth; or combinations thereof. The synthetic resin of the chassis base 30 may also include a reinforcing material such as an aromatic nylon fiber for providing improved plasticity, stiffness, and thermal resistance to the resin. Examples of suitable aromatic nylons include glass fiber, carbon fiber, Kevlar, and the like.

The driving boards 40 may contain power supplying circuits and control signal generating circuits to drive the PDP 10. During operation, driving boards 40 generate heat that may be discharged with heat discharging plates (not shown).

The plasma display module may also include gap pads 50 interposed between the chassis base 30 and the driving boards 40 to discharge the heat generated by the driving boards 40. However, since the chassis base 30 may be made of a synthetic resin, a material exhibiting insulating properties, the heat discharging capabilities of the gap pads 50 may be reduced when they are in contact with the chassis base 30.

Therefore, the inventive plasma display module may include a plurality of mounting holes 32 that are formed in the chassis base 30. The mounting holes 32 may be formed in the chassis base 30, such that the mounting holes 32 extend through the chassis base 30 at locations corresponding to the driving boards 40. The gap pads 50 may be mounted in the mounting holes 32 of the chassis base 30, such that they are in direct contact with the driving boards 40 at one side thereof and in direct contact with the heat conductive sheet 22, which is attached to the rear surface of the plasma display panel 10, at the other side thereof. In this regard, it should be noted that the heat conductive sheet 22 is not in direct contact with the chassis base 30 because of the insulating properties of the synthetic resin of the chassis base 30.

In accordance with the present invention, when the PDP 10 is driven, the large amount of heat generated by the driving boards 40 may be transferred through the gap pads 50 toward the heat conductive sheet 22, which, in turn, may discharge the heat. When the gap pads 50 are used as heat discharging members, the heat conductive sheet 22 may be made of a highly thermally conductive material, e.g., graphite, that dissipates the heat, thereby maximizing the heat discharging efficiency of the heat conductive sheet 22.

Figure 3:
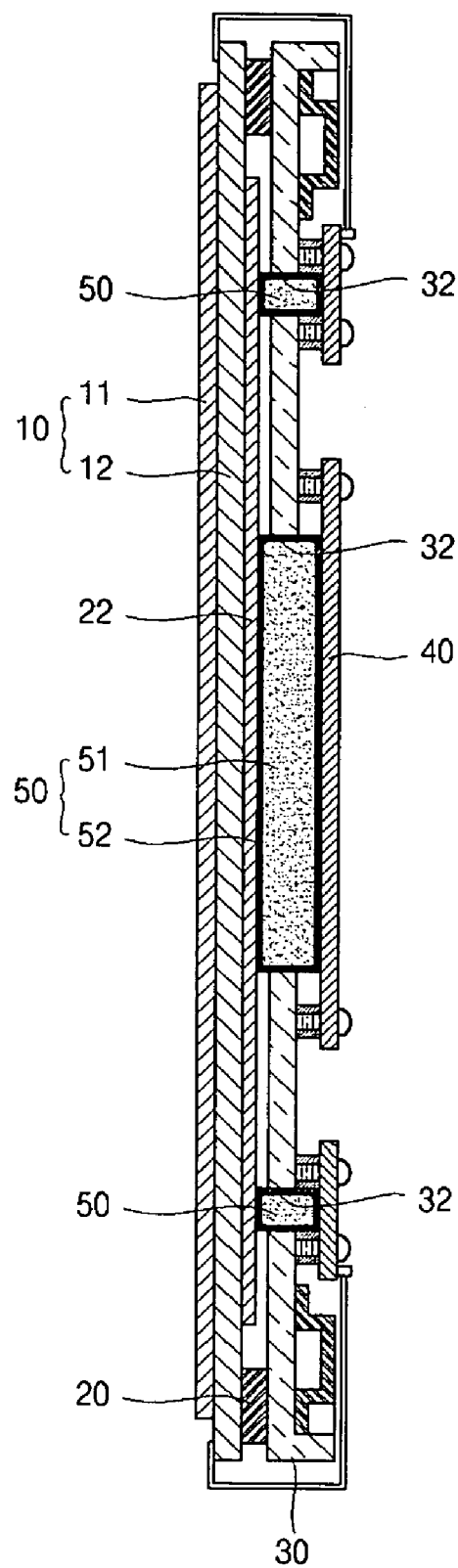
FIG. 3 illustrates a sectional view of a plasma display module according to another embodiment of the present invention.

It should be noted that gap pads 50 may also be used as electricity conducting members to provide an electrical conductive medium between the grounded portion of the driving boards 40 and the heat conductive sheet 22. In this case, the heat conductive sheet 22 may be made of a material that is both electrically and thermally conductive, e.g., aluminum or aluminum alloy. Alternatively, the gap pads 50 may be made of a heat discharging material coated with a conductive material, e.g., layers 51 and 52 respectively, as illustrated in FIG. 3. As such, the gap pads 50 can both discharge the heat of the driving boards 40 and provide a grounding pathway for them. It should be noted, that the remaining elements of the plasma display module of FIG. 3 are the same as those in FIGS. 1 and 2; therefore, no further discussion thereof is needed.

Figure 4:
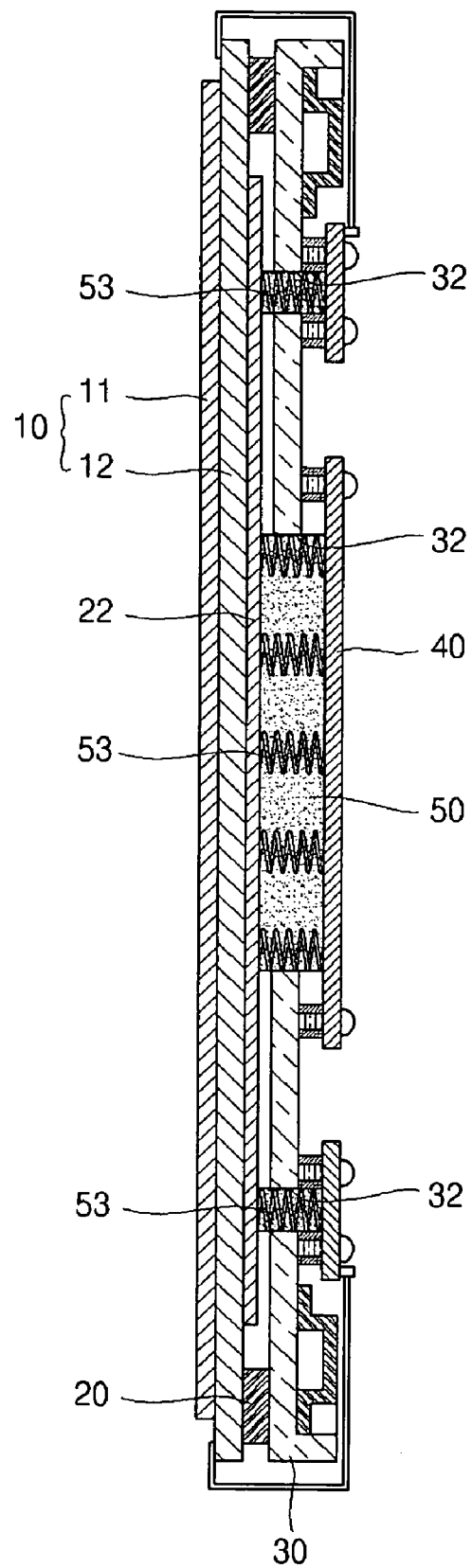
FIG. 4 illustrates a sectional view of a plasma display module according to another embodiment of the present invention.

When the PDP is driven, vibrations may be generated by the driving boards 40. Therefore, in accordance with another aspect of the present invention, the gap pads 50 may be made of a vibration absorbing material or replaced with vibration absorbing members such as springs 53, as illustrated in FIG. 4, sponges (not shown), and so forth. When the gap pads 50 are used as vibration absorbing members, they may absorb vibrations generated by the driving boards 40, thereby obtaining a vibration minimizing effect, as well as providing grounding pathways to the driving boards 40. It should be noted, that the remaining elements of the plasma display module of FIG. 3 are the same as those in FIGS. 1 and 2; therefore, no further discussion thereof is needed.

According to the present invention, the reduced distance between the driving boards 40 and the chassis base 30, achieved by mounting the gap pads 50 in the mounting holes 32, may be an additional feature improving the discharge of heat generated by the driving boards 40 and transferred to the heat conductive sheet 22 attached to the rear surface of the PDP.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A plasma display module, comprising:
a plasma display panel having front and rear surfaces;
a chassis base made of a synthetic resin, the chassis base being mounted on the rear surface of the plasma display and including a plurality of mounting holes;
a heat conductive sheet disposed between the plasma display panel and the chassis base;
a plurality of driving boards being mounted on a rear surface of the chassis base, the driving boards including a plurality of circuits electrically connected to the plasma display panel; and
a plurality of gap pads mounted in the mounting holes of the chassis base between the heat conductive sheet and the driving boards.

2. The plasma display module as claimed in claim 1, wherein the gap pads mounted in the mounting holes are in contact with the driving boards at one side thereof and in contact with the heat conductive sheet at another side thereof.

3. The plasma display module as claimed in claim 1, wherein the gap pads are heat discharging members exhibiting heat conductivity.

4. The plasma display module as claimed in claim 1, wherein the heat conductive sheet is made of graphite.

5. The plasma display module as claimed in claim 3, wherein an outer peripheral surface of the gap pads is coated with a conductive material.

6. The plasma display module as claimed in claim 1, wherein the gap pads are electrically conductive members.

7. The plasma display module as claimed in claim 1, wherein the heat conductive sheet is made of aluminum material.

8. The plasma display module as claimed in claim 1, wherein the gap pads are adapted to absorb vibrations.

9. The plasma display module as claimed in claim 1, wherein the chassis base comprises at least one synthetic resin selected from the group consisting of a thermosetting resin, a thermoplastic resin, and combinations thereof.

10. The plasma display module as claimed in claim 9, wherein the synthetic resin further comprises a reinforcing material.

11. The plasma display module as claimed in claim 9, wherein the synthetic resin exhibits insulating properties.

12. The plasma display module as claimed in claim 11, wherein the chassis base is spaced apart from the heat conductive sheet.

13. The plasma display module as claimed in claim 1, wherein the gap pads extend entirely through the chassis base in a direction perpendicular to a plane of the chassis base.

14. The plasma display module as claimed in claim 1, wherein the gap pads are thicker than the chassis base along a direction perpendicular to a plane of the chassis base.

15. The plasma display module as claimed in claim 1, wherein the gap pads overlap with the driving boards.

16. The plasma display module as claimed in claim 2, wherein the gap pads are in direct contact with the driving boards and the heat conductive sheet.

17. The plasma display module as claimed in claim 2, wherein the gap pads are in direct contact with the driving boards.

18. The plasma display module as claimed in claim 1, wherein the gap pads completely fill the mounting holes of the chassis base to contact the chassis base.

19. The plasma display module as claimed in claim 1, wherein the gap pads extend from a surface of the heat conductive sheet to a surface of the driving boards, a thickness of the gap pads along a normal to the plasma display panel being substantially equal a distance between the heat conductive sheet and the driving boards.

* * * * *